US008282995B2

(12) United States Patent
Calzia et al.

(10) Patent No.: US 8,282,995 B2
(45) Date of Patent: *Oct. 9, 2012

(54) SELENIUM/GROUP 1B/GROUP 3A INK AND METHODS OF MAKING AND USING SAME

(75) Inventors: Kevin Calzia, Philadelphia, PA (US); David Mosley, Philadelphia, PA (US); David L. Thorsen, Pitman, NJ (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 91 days.

This patent is subject to a terminal disclaimer.

(21) Appl. No.: 12/895,297

(22) Filed: Sep. 30, 2010

(65) Prior Publication Data

US 2012/0082794 A1  Apr. 5, 2012

(51) Int. Cl.
*B05D 3/02* (2006.01)
*C09D 11/00* (2006.01)
(52) U.S. Cl. ............ 427/380; 106/1.05; 106/31.13; 106/31.92; 252/500; 257/42; 257/E21.068; 257/E21.09; 257/E21.114; 257/E29.296; 427/384; 438/95; 438/102; 438/197; 438/285; 438/478; 438/590; 438/602
(58) Field of Classification Search .......... 106/1.05, 106/31.13, 31.92; 136/262; 427/76, 380, 427/384, 256; 438/95, 102, 104, 197, 285, 438/478, 483, 502, 590, 603, 602; 252/500, 252/512; 257/42, E21.09, E21.068, E21.633, 257/E21.114, E21.411, E29.296

See application file for complete search history.

(56) References Cited

U.S. PATENT DOCUMENTS

| | | | |
|---|---|---|---|
| 4,520,010 A | 5/1985 | Badesha et al. | |
| 6,379,585 B1 | 4/2002 | Vecht et al. | |
| 6,518,086 B2 | 2/2003 | Beck et al. | |
| 6,875,661 B2 | 4/2005 | Mitzi et al. | |
| 7,094,651 B2 | 8/2006 | Mitzi et al. | |
| 7,163,835 B2 | 1/2007 | Meth | |
| 7,341,917 B2 | 3/2008 | Millron et al. | |
| 7,494,841 B2 | 2/2009 | Mitzi et al. | |
| 2007/0166453 A1 | 7/2007 | VanDuren et al. | |
| 2008/0124831 A1 | 5/2008 | Robinson et al. | |
| 2008/0280030 A1 | 11/2008 | VanDuren et al. | |
| 2009/0025640 A1 | 1/2009 | Sager et al. | |
| 2009/0145482 A1 | 6/2009 | Mitzi et al. | |
| 2009/0260670 A1* | 10/2009 | Li ........................ | 136/244 |
| 2011/0076798 A1* | 3/2011 | Calzia et al. .............. | 438/102 |

FOREIGN PATENT DOCUMENTS

| | | |
|---|---|---|
| WO | 8810513 | 12/1988 |
| WO | 9304212 | 3/1993 |
| WO | 9855395 | 12/1998 |
| WO | 2008057119 | 5/2008 |
| WO | 2008063190 | 5/2008 |
| WO | 2009089754 | 7/2009 |

OTHER PUBLICATIONS

Copending, commonly owned U.S. Appl. No. 12/568,189, filed Oct. 28, 2009.
Copending, commonly owned U.S. Appl. No. 12/782,081, filed May 18, 2010.
Mitzi, et al., A high-efficiency solution-deposited thin-film photovoltaic device, Advanced Materials, vol. 20, pp. 3657-3662 (2008).
Mitzi, et al., Low-voltage transistor employing a high-mobility spin-coated chalcogenide semiconductor, Advanced Materials, vol. 17, pp. 1285-1289 (2005).
Lu, et al., Study of the dissolution behavior of selenium and tellurium in different solvents—a novel route to Se, Te tubular bulk single crystals, Journal of Materials Chemistry, vol. 12, (2002).
Chichibu, et al. Use of diethylselenide as a less-hazardous source for preparation of CuInSe2 photo-absorbers by selenization of metal precursors, Journal of Crystal Growth, vol. 243, (2002).
Kemell, et al., Thin film deposition methods for CuInSe2 solar cells, Critical Reviews in Solid State and Materials Sciences, vol. 30, pp. 1-31 (2005).
Pejova, et al., Chemical deposition and characterization of Cu¬3Se¬2¬ and CuSe thin films, Journal of Solid State Chemistry, 158, pp. 49-54 (2001).
Kanatzidis, et al., Coordination chemistry of heavy polychalcogenide ligands, Coordination Chemistry Reviews, vol. 130, pp. 509-621 (1994).
Weil, et al., CuInS2 Solar Cells by Air Stable Ink Rolling, Journal of American Chemical Society, vol. 132, No. 19, pp. 6642-6643 (2010).
Ryan, et al. Preparation of Dithioselenides via a Selenium Transfer Reagent, Tetrahedron Letters, vol. 38, No. 51, pp. 8829-8832 (1997).
Park, et al., Synthesis of CIGS absorber layers via a paste coating, J. Crystal Growth, 311, pp. 2621-2625 (2009).
Li, et al., Solution-Processed Inorganic Solar Cell Based on in Situ Synthesis and Film Deposition of CuInS2 Nanocrystals, J. American Chemical Society vol. 132, No. 1, pp. 22-23 (2010).
Kaelin, et al., Low-cost CIGS solar cells by paste coating and selenization, Thin Solid Films, 480-481, pp. 486-490 (2005).
Fischereder, et al., Investigation of Cu2ZnSnS4 Formation from Metal Salts and Thioacetamide, Chemistry of Materials vol. 22, No. 11, pp. 3399-3406 (2010).

* cited by examiner

*Primary Examiner* — Bijan Ahvazi
(74) *Attorney, Agent, or Firm* — Thomas S. Deibert

(57) ABSTRACT

A selenium/Group Ib/Group 3a ink is provided, comprising, as initial components: (a) a selenium/Group Ib/Group 3a system which comprises a combination of, as initial components: a selenium; an organic chalcogenide component; a Group Ib containing substance; optionally, a bidentate thiol component; a Group 3a containing substance; and, (b) a liquid carrier component; wherein the selenium/Group Ib/Group 3a system is stably dispersed in the liquid carrier component. Also provided are methods of preparing the selenium/Group Ib/Group 3a ink and for using the selenium/Group Ib/Group 3a ink to deposit a selenium/Group Ib/Group 3a material on a substrate for use in the manufacture of a variety of chalcogenide containing semiconductor materials, such as, thin film transistors (TFTs), light emitting diodes (LEDs); and photoresponsive devices (e.g., electrophotography (e.g., laser printers and copiers), rectifiers, photographic exposure meters and photovoltaic cells) and chalcogenide containing phase change memory materials.

10 Claims, No Drawings

SELENIUM/GROUP 1B/GROUP 3A INK AND METHODS OF MAKING AND USING SAME

The present invention relates to a selenium/Group 1b/Group 3a ink comprising: (a) a selenium/Group 1b/Group 3a system which comprises a combination of, as initial components: a selenium; an organic chalcogenide component: comprising at least one organic chalcogenide having a formula selected from RZ—Z'R' and $R^2$—SH; wherein Z and Z' are independently selected from sulfur, selenium and tellurium; wherein R is selected from H, $C_{1-20}$ alkyl group, a $C_{6-20}$ aryl group, a $C_{1-20}$ hydroxyalkyl group, a $C_{1-20}$ mercaptoalkyl group and an ether group; wherein R' and $R^2$ are selected from a $C_{1-20}$ alkyl group, a $C_{6-20}$ aryl group, a $C_{1-20}$ hydroxyalkyl group, a $C_{1-20}$ mercaptoalkyl group and an ether group; a Group 1b containing substance comprising, as an initial component, at least one of $CuCl_2$ and $Cu_2O$; optionally, a bidentate thiol component; a Group 3a containing substance comprising, as an initial component: a Group 3a material selected from aluminum, indium, gallium and combinations thereof; and, (b) a liquid carrier component; wherein the selenium/Group 1b/Group 3a system is stably dispersed in the liquid carrier component. The present invention further relates to a method of preparing the selenium/Group 1b/Group 3a ink and for using the selenium/Group 1b/Group 3a ink to deposit a selenium/Group 1b/Group 3a material on a substrate.

The fabrication of thin films of selenium/Group 1b/Group 3a material have been studied extensively over the past two decades for use in a number of potential applications, including, for example, switching devices, photovoltaics, nonlinear optics, ionic batteries and high density phase change data storage devices.

One very promising application for selenium/Group 1b/Group 3a materials is in the manufacture of photovoltaic cells for the conversion of sunlight into electricity. In particular, the manufacture of photovoltaic cells based on Group 1b-3a-6a mixed-metal chalcogenide materials, including for example, copper-indium-diselenide ($CuInSe_2$), copper-gallium-diselenide ($CuGaSe_2$) and copper-indium-gallium-diselenide ($CuIn_{1-x}Ga_xSe_2$), are of considerable interest because of their high solar energy to electrical energy conversion efficiencies. The Group 1b-3a-6a mixed metal chalcogenide semiconductors are sometimes referred to generically as CIGS materials. Conventional CIGS solar cells include a back electrode such as a layer of molybdenum, a CIGS absorber layer, a CdS junction partner layer, an optional transparent buffer layer such as a zinc oxide, and a transparent conductive oxide layer electrode (e.g., aluminum doped $ZnO_x$, indium tin oxide, $SnO_2$); wherein the molybdenum layer is deposited over a substrate, the CIGS absorber layer is interposed between the molybdenum layer and the CdS junction partner and the CdS junction partner is interposed between the CIGS absorber layer and the transparent conductive oxide layer electrode.

One challenge for the promising use of deposited films of selenium/Group 1b/Group 3a materials is the development of cost-effective manufacturing techniques. Conventional methods for depositing selenium/Group 1b/Group 3a materials typically involve the use of vacuum based processes, including, for example, vacuum evaporation, sputtering and chemical vapor deposition (e.g., metal-organic chemical vapor deposition). Such deposition techniques tend to exhibit low throughput capabilities and high cost. To facilitate the large scale, high throughput, low cost, manufacture of systems incorporating the use of deposited selenium/Group 1b/Group 3a materials, it would be desirable to provide liquid based deposition techniques.

A method for the liquid deposition of a semiconductor precursor film is disclosed in U.S. Pat. No. 6,126,740 to Schulz et al. Schulz et al. disclose a colloidal suspension comprising metal chalcogenide nanoparticles and a volatile capping agent, wherein the colloidal suspension is made by the reaction of a metal salt with a chalcogenide salt in an organic solvent to precipitate a metal chalcogenide, recovery of the metal chalcogenide precipitate, and mixing of the metal chalcogenide precipitate with a volatile capping agent in a nonaqueous organic solvent. Schulz et al. further disclose that the colloidal suspension can be spray deposited onto a substrate to produce a semiconductor precursor film. Schulz et al. disclose that particular preferred metals for use in its colloidal suspension and method of use are copper, indium, gallium and cadmium.

One liquid deposition method for depositing selenium in the manufacture of a CIGS material is disclosed by Mitzi, et al. in *A High-Efficiency Solution-Deposited Thin-Film Photovoltaic Device*, ADVANCED MATERIALS, vol. 20, pp. 3657-62 (2008) ("Mitzi I"). Mitzi I discloses the use of a selenium ink comprising hydrazine, inter alia, as a liquid vehicle for depositing selenium in the manufacture of a thin film CIGS layer. Hydrazine, however, is a highly toxic and explosive material. Accordingly, the Mitzi I process has limited value for use in the large scale manufacture of selenium containing semiconductor devices.

An alternative to the hydrazine containing selenium ink described in Mitzi I is disclosed by Mitzi, et al. in *Low-Voltage Transistor Employing a High-Mobility Spin-Coated Chalcogenide Semiconductor*, ADVANCED MATERIALS vol. 17, pp. 1285-89 (2005) ("Mitzi II"). Mitzi II discloses the use of a hydrazinium precursor material for deposition of indium selenide to form an indium selenide channel of a thin film transistor. Mitzi II further asserts that its hydrazinium approach is likely extendable to other chalcogenides besides $SnS_{2-x}Se_x$, $GeSe_2$, and $In_2Se_3$ systems.

The hydrazinium precursor materials disclosed by Mitzi, et al. remove hydrazine from the manufacturing step to produce semiconductor films. Notwithstanding, Mitzi, et al. do not eliminate the need for hydrazine. Rather, Mitzi, et al. still utilize hydrazine in the preparation of the hydrazinium precursor materials. Moreover, hydrazinium ion precursors pose a significant explosion risk, as documented by Eckart W. Schmidt in his book, *Hydrazine and Its Derivatives: Preparation, Properties, and Applications*, JOHN WILEY & SONS pp 392-401 (1984). The presence of numerous metal ions exacerbates the risk of hydrazinium explosion or detonation. This can be a problem because residual hydrazinium salts may accumulate in process equipment during manufacture, presenting an unacceptable safety risk.

Accordingly, there remains a need for a liquid deposition method for use in the manufacture of systems incorporating selenium/Group 1b/Group 3a semiconductors (e.g., switching devices, photovoltaics, nonlinear optics, ionic batteries and high density phase change data storage devices). In particular, there remains a need for a formulated selenium/Group 1b/Group 3a ink that facilitates the deposition of a selenium/Group 1b/Group 3a material, preferably wherein the selenium/Group 1b/Group 3a ink formulations are hydrazine and hydrazinium free.

The present invention provides a selenium/Group 1b/Group 3a ink, comprising: (a) a selenium/Group 1b/Group 3a system which comprises a combination of, as initial components: a selenium; an organic chalcogenide component: comprising at least one organic chalcogenide having a formula selected from RZ—Z'R' and $R^2$—SH; wherein Z and Z' are independently selected from sulfur, selenium and tellurium; wherein R is selected from H, $C_{1-20}$ alkyl group, a $C_{6-20}$ aryl group, a $C_{1-20}$ hydroxyalkyl group, a $C_{1-20}$ mercaptoalkyl group and an ether group; wherein R' and $R^2$ are selected from a $C_{1-20}$ alkyl group, a $C_{6-20}$ aryl group, a $C_{1-20}$ hydroxyalkyl group, a $C_{1-20}$ mercaptoalkyl group and an ether group; a Group 1b containing substance comprising, as an initial component, at least one of $CuCl_2$ and $Cu_2O$; optionally, a bidentate thiol component; a Group 3a containing substance comprising, as an initial component: a Group 3a material selected from aluminum, indium, gallium and combinations thereof; and, (b) a liquid carrier component; wherein the selenium/Group 1b/Group 3a system is stably dispersed in the liquid carrier component.

The present invention provides a method of preparing a selenium/Group 1b/Group 3a ink according to claim 1, comprising: providing a selenium; providing an organic chalcogenide component, comprising: a first organic chalcogenide and a second organic chalcogenide both having a formula independently selected from RZ—Z'R' and $R^2$—SH; wherein Z and Z' are independently selected from sulfur, selenium and tellurium; wherein R is selected from H, $C_{1-20}$ alkyl group, a $C_{6-20}$ aryl group, a $C_{1-20}$ hydroxyalkyl group, a $C_{1-20}$ mercaptoalkyl group and an ether group; wherein R' and $R^2$ are selected from a $C_{1-20}$ alkyl group, a $C_{6-20}$ aryl group, a $C_{1-20}$ hydroxyalkyl group, a $C_{1-20}$ mercaptoalkyl group and an ether group; providing a Group 1b containing substance comprising, as an initial component: at least one of $CuCl_2$ and $Cu_2O$; providing a Group 1b ligand component; providing a Group 3a containing substance comprising, as an initial component: a Group 3a material selected from aluminum, indium, gallium and combinations thereof; providing a liquid carrier component, comprising: a first liquid carrier, a second liquid carrier and a third liquid carrier; combining the selenium, the first organic chalcogenide and the first liquid carrier; heating the combination with agitation to produce a combined selenium/organic chalcogenide component; combining the Group 1b containing substance, the Group 1b ligand component and the second liquid carrier to produce a Group 1b material/ligand component; combining the Group 3a containing substance, the second organic chalcogenide and the third liquid carrier to produce a Group 3a/organic chalcogenide component; combining the combined selenium/organic chalcogenide component, the Group 1b material/ligand component and the Group 3a/organic chalcogenide component to form the selenium/Group 1b/Group 3a ink; wherein the selenium/Group 1b/Group 3a ink is a stable dispersion; and, wherein the first liquid carrier, the second liquid carrier and the third liquid carrier are the same or are miscible together.

The present invention provides a method for depositing a selenium/Group 1b/Group 3a material on a substrate, comprising: providing a substrate; providing a selenium/Group 1b/Group 3a ink according to claim 1; depositing the selenium/Group 1b/Group 3a ink on the substrate; heating the deposited selenium/Group 1b/Group 3a ink to eliminate the first liquid carrier, the second liquid carrier and the third liquid carrier leaving a selenium/Group 1b/Group 3a material on the substrate; and, optionally, annealing the selenium/Group 1b/Group 3a material; wherein the selenium/Group 1b/Group 3a material is according to the formula $Na_L Cu_m Ga_d In_{(1-d)} S_{(2+e)(1-f)} Se_{(2+e)f}$ wherein $0 \leq L \leq 0.25$, $0.25 \leq m \leq 1.5$, $0 \leq d \leq 1$, $-0.2 \leq e \leq 0.5$, $0 < f \leq 1$; wherein $0.5 \leq (L+m) \leq 1.5$ and $1.8 \leq \{(2+e)f + (2+e)(1-f)\} \leq 2.5$

DETAILED DESCRIPTION

The term "stable" as used herein and in the appended claims in reference to the selenium/Group 1b/Group 3a ink means that the product formed by the combination of selenium, an organic chalcogenide component, a Group 1b containing substance, a Group 1b ligand component and a Group 3a containing substance in the liquid carrier component does not form a precipitate during storage of the selenium/Group 1b/Group 3a ink at 22° C. under nitrogen for a period of at least fifteen (15) minutes.

The term "hydrazine free" as used herein and in the appended claims in reference to the selenium/Group 1b/Group 3a ink means that the selenium/Group 1b/Group 3a ink contains <100 ppm hydrazine.

The term "hydrazinium free or $(N_2H_5)^+$ free" as used herein and in the appended claims in reference to the selenium/Group 1b/Group 3a ink means that the selenium/Group 1b/Group 3a ink contains <100 ppm hydrazinium complexed with selenium.

The present invention relates to a selenium/Group 1b/Group 3a ink, the preparation of the selenium/Group 1b/Group 3a ink and the use of the selenium/Group 1b/Group 3a ink in the manufacture of selenium/Group 1b/Group 3a containing devices such as thin film transistors (TFTs), light emitting diodes (LEDs); phase change alloys for use in memory devices; and photo responsive devices {e.g., electrophotography (e.g., laser printers and copiers), rectifiers, photographic exposure meters and photovoltaic cells}. The following detailed description focuses on the use of the selenium/Group 1b/Group 3a ink of the present invention in the preparation of CIGS materials designed for use in photovoltaic cells.

Preferably, the selenium used, as an initial component, in the present invention comprises selenium powder.

The organic chalcogenide component used, as an initial component, in the present invention, comprises: at least one organic chalcogenide having a formula selected from RZ—Z'R' and $R^2$—SH; wherein Z and Z' are independently selected from sulfur, selenium and tellurium (preferably sulfur and selenium; most preferably sulfur); wherein R is selected from H, a $C_{1-20}$ alkyl group, a $C_{6-20}$ aryl group, a $C_{1-20}$ hydroxyalkyl group, a $C_{1-20}$ mercaptoalkyl group, and an ether group (preferably R is selected from a $C_{1-20}$ alkyl group, a $C_{6-20}$ aryl group, a $C_{1-20}$ hydroxyalkyl group, and a $C_{3-20}$ ether group; more preferably R is selected from a $C_{1-20}$ alkyl group, a $C_{1-20}$ hydroxyalkyl group, and a $C_{6-20}$ aryl group; still more preferably R is selected from a $C_{1-10}$ alkyl group and a $C_{1-10}$ hydroxyalkyl group; most preferably R is selected from a $C_{1-5}$ alkyl group and a $C_{1-5}$ hydroxyalkyl group); wherein R' is selected from a $C_{1-20}$ alkyl group, a $C_{6-20}$ aryl group, a $C_{1-20}$ hydroxyalkyl group, a $C_{1-20}$ mercaptoalkyl group, and an ether group (preferably R' is selected from a $C_{1-20}$ alkyl group, a $C_{6-20}$ aryl group, a $C_{1-20}$ hydroxyalkyl group, and a $C_{3-20}$ ether group; more preferably R' is selected from a $C_{1-20}$ alkyl group, a $C_{1-20}$ hydroxyalkyl group, and a $C_{6-20}$ aryl group; still more preferably R' is selected from a $C_{1-10}$ alkyl group and a $C_{1-10}$ hydroxyalkyl group; most preferably R' is selected from a $C_{1-5}$ alkyl group and a $C_{1-5}$ hydroxyalkyl group); and wherein $R^2$ is selected from a $C_{1-20}$ alkyl group, a $C_{6-20}$ aryl group, a $C_{1-20}$ hydroxyalkyl group, a $C_{1-20}$ mercaptoalkyl group, and an ether group (preferably $R^2$ is selected from a $C_{1-20}$ alkyl group, a $C_{6-20}$ aryl group, a $C_{1-20}$ hydroxyalkyl group, and a $C_{3-20}$ ether group; more preferably $R^2$ is selected from a $C_{1-20}$ alkyl group, $C_{1-20}$ hydroxyalkyl group and a $C_{6-20}$ aryl group; still more preferably $R^2$ is selected from a $C_{1-10}$ alkyl group and a $C_{1-10}$ hydroxyalkyl group; most preferably $R^2$ is selected from a $C_{1-5}$ alkyl group and a $C_{1-5}$ hydroxyalkyl group). Optionally, R, R' and $R^2$ are selected to enhance the solubility of the organic chalcogenide in the liquid carrier component.

Optionally, Z and Z' are both sulfur. Preferably, when both Z and Z' are sulfur, R and R' are independently selected from a phenyl group, a methyl group, an ethyl group, a hydroxyethyl group, a propyl group, a butyl group, an isopropyl group and a tert-butyl group. More preferably, when both Z and Z' are sulfur, R and R' are independently selected from a butyl group, a tert-butyl group and a hydroxyethyl group.

Optionally, Z and Z' are both selenium. Preferably, when both Z and Z' are selenium, R and R' are independently selected from a phenyl group, a methyl group, an ethyl group, a propyl group, a butyl group, an isopropyl group and a tert-butyl group. More preferably, when both Z and Z' are selenium, R and R' are both a phenyl group.

The Group 1b containing substance used, as an initial component, in the present invention preferably contains copper. Most preferably, the Group 1b containing substance used, as an initial component, is selected from $CuCl_2$ and $Cu_2O$.

The Group 1b containing substance used, as an initial component, preferably associates with a Group 1b ligand component present in the selenium/Group 1b/Group 3a ink of the present invention. Preferably, the Group 1b ligand component is selected from an organic chalcogenide having a formula $R^2$—SH (as described above) and a bidentate thiol compound. The bidentate thiol compound is preferably selected from dithiols, hydroxy thiols and nitrogen containing thiols (preferably dithiols, hydroxy thiols and nitrogen containing thiols, wherein the active chelating groups on the bidentate thiol ligand are separated by a chain of ≦four carbons (i.e., —C—C—C—C—); more preferably dithiols, hydroxy thiols and nitrogen containing thiols, wherein the active chelating groups on the bidentate thiol ligand are separated by a chain of two carbons (i.e., —C—C—)). Most preferably, the bidentate thiol compound is selected from 1,2-dimercaptoethane; 1,3-dimercaptopropane; beta-mercaptoethanol and dimercaptol.

The Group 3a containing substance used, as an initial component, in the present invention, comprises: a Group 3a material selected from aluminum, indium, gallium and combinations thereof (preferably wherein the Group 3a material is selected from indium, gallium and combinations thereof; more preferably wherein the Group 3a material is indium).

Liquid carrier component used in the selenium/Group 1b/Group 3a ink of the present invention can be any solvent or miscible mixtures of solvents in which the product formed by the combination of selenium, the organic chalcogenide component, the Group 1b containing substance, the Group 1b ligand component and the Group 3a containing substance is stably dispersible. Preferably, the liquid carrier component used is selected from amines, ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier component used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and miscible mixtures thereof. Optionally, the liquid carrier component is selected from a nitrogen containing solvent and a miscible mixture of nitrogen containing solvents. Preferably, the liquid carrier component used comprises a liquid amine having a formula $NR_3$, wherein each R is independently selected from a H, a $C_{1-10}$ alkyl group, a $C_{6-10}$ aryl group, a $C_{3-10}$ aminocycloalkyl group (e.g., 1,2-diamino cyclohexyl) and a $C_{1-10}$ aminoalkyl group. Preferably, the liquid carrier component used in the preparation of the selenium/Group 1b/Group 3a ink of the present invention is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine and mixtures thereof. More preferably, the liquid carrier component used is selected from ethylene diamine; diethylenetriamine; tris(2-aminoethyl)amine; triethylenetetramine; n-hexylamine; pyrrolidine; n-butylamine; 1,3-diaminopropane; 3-amino-1-propanol; 1-amino-2-propanol and mixtures thereof. Still more preferably, the liquid carrier used is selected from ethylene diamine, diethylenetriamine, pyrrolidine, n-butylamine and mixtures thereof. Yet still more preferably, the liquid carrier used is selected from ethylene diamine, diethylenetriamine and mixtures thereof. Most preferably, the liquid carrier used is a mixture of ethylene diamine and diethylenetriamine.

Optionally, the selenium/Group 1b/Group 3a ink of the present invention, further comprises sodium.

Optionally, the selenium/Group 1b/Group 3a ink of the present invention is a non-aqueous ink (i.e., contains ≦10 wt %, preferably ≦1 wt %, most preferably ≦0.1 wt % water).

The selenium/Group 1b/Group 3a ink of the present invention can, optionally, further comprise a cosolvent. Cosolvents suitable for use with the present invention are miscible with the liquid carrier. Preferred cosolvents exhibit a boiling point within 30° C. of the boiling point of the liquid carrier.

The selenium/Group 1b/Group 3a ink of the present invention can, optionally, further comprise at least one optional additive selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional additives can be incorporated into the selenium/Group 1b/Group 3a ink of the present invention to, for example, facilitate increased shelf life, to improve flow characteristics to facilitate the method of application to a substrate (e.g., printing, spraying), to modify the wetting/spreading characteristics of the ink onto the substrate, to enhance the compatibility of the selenium/Group 1b/Group 3a ink with other inks used to deposit other components on the substrate (e.g., other constituents of a CIGS material, such as Cu, In, Ga, and S), and to modify the decomposition temperature of the selenium/Group 1b/Group 3a ink. Some optional flow control and viscosity modifiers include polyethyleneimines, polyvinylpyrrolidones and Jeffamines.

The relative amounts of selenium, Group 1b material (e.g., copper) and Group 3a material (e.g., indium) contained in the selenium/Group 1b/Group 3a ink of the present invention can be selectively provided to suit the particular application need and the processing technology and equipment to be used to apply the selenium/Group 1b/Group 3a ink to a given substrate. Preferably, the selenium/Group 1b/Group 3a ink exhibits a selenium content selected from 1 to 50 wt %; 1 to 5 wt %; 4 to 15 wt % and 5 to 10 wt % (based on the weight of the selenium/Group 1b/Group 3a ink). Preferably, the selenium/Group 1b/Group 3a ink exhibits a Group 1b material (i.e., copper) content selected from 0.4 to 10 wt % (based on the weight of the selenium/Group 1b/Group 3a ink). Preferably, the selenium/Group 1b/Group 3a ink exhibits a Group 3a material (e.g., indium, gallium) content of 0.4 to 10 wt % (based on the weight of the selenium/Group 1b/Group 3a ink). Preferably, selenium/Group 1b/Group 3a ink exhibits a molar ratio of selenium to Group 1b material to Group 3a material of 2:0.5:1 to 10:1.5:1.

Preferably, the method of preparing a selenium/Group 1b/Group 3a ink of the present invention, comprises: providing a selenium; providing an organic chalcogenide component, comprising: a first organic chalcogenide and a second organic chalcogenide; wherein the first organic chalcogenide and the second organic chalcogenide each have a formula independently selected from RZ—Z'R' and $R^2$—SH (as described hereinabove); providing a Group 1b containing substance comprising, as an initial component, at least one of $CuCl_2$ and $Cu_2O$; providing a Group 1b ligand component (preferably, wherein the Group 1b ligand component is selected from a material having a formula $R^2$—SH and a bidentate thiol compound, as described hereinabove); providing a Group 3a containing substance, comprising: a Group 3a material selected from aluminum, indium, gallium and combinations thereof; providing a liquid carrier component, comprising: a first liquid carrier, a second liquid carrier and a third liquid carrier; combining the selenium component, the first organic chalcogenide and the first liquid carrier; heating the combination with agitation to produce a combined selenium/organic chalcogenide component; combining the Group 1b containing substance, the Group 1b ligand component and the second liquid carrier to produce a Group 1b material/ligand component; combining the Group 3a containing substance, the second organic chalcogenide and the third liquid carrier to produce a Group 3a/organic chalcogenide component; combining the combined selenium/organic chalcogenide component, Group 1b material/ligand component and the Group 3a/organic chalcogenide component to form the selenium/Group 1b/Group 3a ink; wherein the selenium/Group 1b/Group 3a ink is a stable dispersion; wherein the first organic chalcogenide and the second organic chalcogenide are both independently selected from organic chalcogenide components as defined herein above (i.e., the first organic chalcogenide and the second organic chalcogenide can be the same or different); and wherein the first liquid carrier, the second liquid carrier and the third liquid carrier are all selected from liquid carriers as defined herein above and are all the same or are miscible together (i.e. they can be different, but must be miscible).

Preferably, the selenium provided for use in making the selenium ink of the present invention is selenium powder.

Preferably, the selenium provided for use in making the selenium/Group 1b/Group 3a ink of the present invention contributes 1 to 50 wt %, 1 to 20 wt %, 1 to 5 wt %, 4 to 15 wt %, or 5 to 10 wt % of the selenium/Group 1b/Group 3a ink produced.

In providing the selenium/Group 1b/Group 3a ink of the present invention, the organic chalcogenide provided is selected from a thiol, an organic dichalcogenide and mixtures thereof. When a thiol is used, the thiol preferably has a formula $R^2$—SH (as described hereinabove). When an organic dichalcogenide is used, the organic dichalcogenide preferably has a formula RZ—Z'R' (as described hereinabove). The $R^2$, R and R' groups in the thiol and organic dichalcogenide used can be selected to enhance the solubility of the product formed by the combination of selenium, the organic chalcogenide component, the Group 1b containing substance, the Group 3a containing substance, and the optional bidentate thiol ligand in the liquid carrier.

In providing the selenium for use in the preparation of the selenium/Group 1b/Group 3a ink of the present invention, the selenium and the first liquid carrier are preferably combined by adding the first liquid carrier to the selenium. More preferably, the selenium and the first liquid carrier are combined using inert techniques, followed with continuous agitation and heating to reflux until the selenium is dissolved in the first liquid carrier. Preferably, the first liquid carrier is maintained at a temperature of 20 to 240° C. during the combining of the first liquid carrier and the selenium. Optionally, the first liquid carrier and selenium can be heated above the melting point of selenium (220° C.) during the combining process.

Optionally, the selenium and the first organic chalcogenide are combined to form a combined selenium/organic chalcogenide component for use in the preparation of the selenium/Group 1b/Group3a ink of the present invention. The formation of a combined selenium/organic chalcogenide component preferably, comprises: providing selenium, providing the first organic chalcogenide having a formula selected from RZ—Z'R' and $R^2$—SH (as described hereinabove), and providing the first liquid carrier; combining the selenium, the first organic chalcogenide and the first liquid carrier; heating the combination (preferably to a temperature within 25° C. of the boiling point temperature of the first liquid carrier, most preferably to heating to reflux) with agitation (preferably for a period of 0.1 to 40 hrs; more preferably for a period of 0.1 to 8 hrs) to form the combined selenium/organic chalcogenide component stably dispersed in the first liquid carrier. Preferably, the molar ratio of selenium to the first organic chalcogenide in the combined selenium/organic chalcogenide component is 2:1 to 20:1, more preferably 2:1 to 14:1, still more preferably 2:1 to 10:1, most preferably 2:1 to 8:1.

When using a first organic chalcogenide in the liquid state, providing the combined selenium/organic chalcogenide component for use in the preparation of the selenium/Group 3a ink of the present invention, optionally, further comprises heating the combined selenium and first liquid carrier before adding the liquid first organic chalcogenide. Preferably, providing the combined selenium/organic chalcogenide component for use in preparation of the selenium/Group 3a ink of the present invention, optionally, further comprises: heating the combined first liquid carrier and selenium powder before and during the addition of the liquid first organic chalcogenide. More preferably, the combined first liquid carrier and selenium powder are maintained at a temperature of 20 to 240° C. during the addition of the liquid first organic chalcogenide. Most preferably, any liquid first organic chalcogenide is added to the combined selenium and first liquid carrier by gradually adding the liquid first organic chalcogenide to the combined selenium and first liquid carrier with continuous agitation and heating to reflux.

Providing the Group 1b containing substance for use in the preparation of the selenium/Group 1b/Group 3a ink of the present invention, preferably comprises: providing a Group 1b containing substance selected from the group consisting of $CuCl_2$ and $Cu_2O$.

Optionally, in providing the Group 1b containing substance for use in the preparation of the selenium/Group 1b/Group 3a ink of the present invention, the Group 1b containing substance, a Group 1b ligand component and the second liquid carrier are combined to form a combined Group 1b material/ligand component. More preferably, the Group 1b containing substance, the Group 1b ligand component and second liquid carrier are combined using inert techniques, followed with continuous agitation and heating to reflux until the solids are dissolved in the second liquid carrier. Preferably, the second liquid carrier is maintained at a temperature of 20 to 150° C. (more preferably a temperature of 20 to 100° C.) during the combining of the Group 1b containing substance, the Group 1b ligand component and the second liquid carrier.

Providing the Group 1b material/ligand component, preferably comprises: providing a Group 1b containing substance selected from $CuCl_2$ and $Cu_2O$; providing a Group 1b ligand component selected from a material having a formula $R^2$—SH (as described hereinabove) and a bidentate thiol compound (as described hereinabove); and providing a second liquid carrier; combining the Group 1b material, the Group 1b ligand compound and the second liquid carrier; heating the combination (preferably to a temperature of 25 to 100° C. with agitation (preferably for a period of 0.1 to 40 hrs; more preferably for a period of 0.1 to 8 hrs) to form the Group 1b material/ligand component stably dispersed in the second liquid carrier. Preferably, the molar ratio of copper to the chelating groups of the Group 1b ligand component in the Group 1b material/ligand component is 2:1 to 1:16, more preferably 2:1 to 1:8, still more preferably 1:1 to 1:6, most preferably 1:1 to 1:4. Most preferably, the Group 1b material/ligand component contains ≧1.0 wt % copper.

Providing the Group 3a containing substance for use in the preparation of the selenium/Group 1b/Group 3a ink of the present invention, preferably comprises: providing a Group 3a containing substance comprising, as initial components: a Group 3a material selected from aluminum, indium, gallium and combinations thereof (preferably wherein the Group 3a material is selected from indium, gallium and combinations thereof; more preferably wherein the Group 3a material is indium); a second organic chalcogenide (as described above); and a third liquid carrier (as described above); combining the Group 3a material, the second organic chalcogenide and the third liquid carrier; heating the combination (preferably to a temperature within 25° C. of the boiling point temperature of the third liquid carrier, most preferably to heating to reflux) with agitation (preferably for a period of 0.1 to 40 hrs; more preferably for a period of 0.1 to 8 hrs) to form the Group 3a/organic chalcogenide component stably dispersed in the third liquid carrier. Preferably, the molar ratio of Group 3a material to second organic chalcogenide used in providing the Group 3a/organic chalcogenide component is 2:3 to 1:6; most preferably 2:3 for organic dichalcogenides (i.e., RZ—Z'R') and 1:3 for thiols (i.e., $R^2$—SH). Preferably, the third liquid carrier is an amine.

Preferably, in providing the selenium/Group 1b/Group 3a ink of the present invention, the timing of the addition of the organic chalcogenide component and the Group 1b ligand component depends on their physical state. For solid organic chalcogenides and solid Group 1b ligand components, the solid organic chalcogenides and solid Group 1b ligand components are preferably combined with other solids (e.g., solid selenium powder, solid Group 3a material, solid Group 1b containing substance) before combination with the liquid carrier component. For liquid organic chalcogenides and liquid Group 1b ligand components, the liquid organic chalcogenide and liquid Group 1b ligand components are preferably added to the liquid carrier component following the addition of at least one of the selenium powder, the Group 1b containing substance and the Group 3a containing substance.

Providing the liquid carrier component for use in the preparation of the selenium/Group 1b/Group 3a ink of the present invention, preferably comprises: providing a liquid carrier (as described hereinabove) in which the product formed by the combination of selenium, the organic chalcogenide component, the Group 1b containing substance, the Group 1b ligand component and the Group 3a containing substance is stable. The liquid carrier component can be provided in separate portions, for example, as a first liquid carrier, a second liquid carrier and a third liquid carrier. The separate portions can vary in volume and composition. The composition of each portion can be the same or can be different, provided that the portions are collectively miscible together.

Optionally, the method of preparing the selenium/Group 1b/Group 3a ink of the present invention, further comprises: providing a sodium source; and combining the sodium source with the combined selenium/organic chalcogenide component, the Group 1b material/ligand component and the Group 3a component.

Optionally, the method of preparing the selenium/Group 1b/Group 3a ink of the present invention, further comprises: providing a cosolvent; and, combining the cosolvent with the selenium, the organic chalcogenide component, the Group 1b containing substance, the Group 1b ligand component, the Group 3a containing substance and the liquid carrier component. Suitable cosolvents are miscible with the liquid carrier component contained in the selenium/Group 1b/Group 3a ink and do not have the effect of destabilizing the selenium/Group 1b/Group 3a ink. Preferred cosolvents further exhibit a boiling point within 30° C. of the boiling point of the liquid carrier component contained in the selenium/Group 1b/Group 3a ink.

Optionally, the method of preparing the selenium/Group 1b/Group 3a ink of the present invention, further comprises: providing an optional agent; and, combining the optional agent with the liquid carrier component; wherein the optional agent is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

The selenium/Group 1b/Group 3a ink of the present invention can be used in the preparation of a variety of semiconductor materials comprising selenium (e.g., thin layer transistors, solar cells, electrophotography components, rectifiers, photographic exposure meters, photocopying media) and in the preparation of chalcogenide containing phase change memory devices.

Preferably, the method for depositing a selenium/Group 1b/Group 3a material on a substrate, comprising: providing a substrate; providing a selenium/Group 1b/Group 3a ink of the present invention; depositing the selenium/Group 1b/Group 3a ink on the substrate; heating the deposited selenium/Group 1b/Group 3a ink to eliminate the first liquid carrier, the second liquid carrier and the third liquid carrier leaving a selenium/Group 1b/Group 3a material on the substrate; and, optionally, annealing the selenium/Group 1b/Group 3a material; wherein the selenium/Group 1b/Group 3a material is according to the formula $Na_LCu_mGa_dIn_{(1-d)}S_{(2+e)(1-f)}Se_{(2+e)f}$ wherein $0 \leq L \leq 0.25$, $0.25 \leq m \leq 1.5$, $0 \leq d \leq 1$, $-0.2 \leq e \leq 0.5$, $0 < f \leq 1$; wherein $0.5 \leq (L+m) \leq 1.5$ and $1.8 \leq \{(2+e)f+(2+e)(1-f)\} \leq 2.5$ The selenium/Group 1b/Group 3a ink of the present invention can be deposited onto a substrate using conventional processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray pyrolysis and spray deposition. Preferably, the selenium/Group 1b/Group 3a ink of the present invention is deposited onto a substrate using conventional spray deposition techniques. Preferably, the selenium/Group 1b/Group 3a ink of the present invention is deposited onto a substrate under an inert atmosphere (e.g., under nitrogen).

Preferably, when treating the deposited selenium/Group 1b/Group 3a material to remove the liquid carrier, the deposited selenium/Group 1b/Group 3a material is heated to a temperature above the boiling point temperature of the liquid carrier. Optionally, the deposited selenium/Group 1b/Group 3a material is heated to a temperature of 5 to 200° C. Optionally, the deposited selenium/Group 1b/Group 3a material is heated to a temperature of 5 to 200° C. under vacuum.

Preferably, the deposited selenium/Group 1b/Group 3a material can be treated to facilitate removal of carbon. Optionally, the deposited selenium/Group 1b/Group 3a material is heated to a temperature of 80 to 450° C. for a period of 30 seconds to one hour in an inert atmosphere.

The substrate used can be selected from conventional materials used in conjunction with the preparation of a semiconductor comprising selenium or in conjunction with chalcogenide containing phase change memory devices. For use in some applications, the substrate preferably comprises a layer of material selected from molybdenum, aluminum and copper. For use in the preparation of CIGS materials for use in photovoltaic devices, the substrate preferably comprises a layer of molybdenum. In some applications, the molybdenum, aluminum or copper substrate layer can be a coating on a carrier substance, such as, glass, foil, and plastic (e.g., polyethylene terephthalate and polyimides). Optionally, the substrate is sufficiently flexible to facilitate roll-to-roll production of CIGS materials for use in photovoltaic devices.

Optionally, the method for depositing a selenium/Group 1b/Group 3a material on a substrate further comprises annealing the deposited selenium/Group 1b/Group 3a material. Annealing temperatures for the deposited selenium/Group 1b/Group 3a material can range from 200 to 650° C. with annealing times of 30 seconds to 5 hours. Optionally, additional Group 6a material can be introduced during the annealing process in the form of at least one of a selenium ink, a selenium vapor, a selenium powder, a hydrogen selenide gas, a sulfur powder and a hydrogen sulfide gas. Optionally, the annealing process is a two stage anneal. In the first annealing stage the deposited material is heated to a temperature of 200 to 500° C. with a first stage annealing time of 30 seconds to 1 hour. In the second annealing stage the deposited material is heated to a temperature of 200 to 650° C. with a second stage annealing time of 30 seconds to 1 hour.

Optionally, the method for depositing a selenium/Group 1b/Group 3a material on a substrate further comprises: providing a sodium source; and depositing sodium on the substrate.

The presence of carbon in deposited CIGS materials negatively affects the electrical properties of devices incorporating the deposited CIGS materials. Accordingly, it is desirable to minimize the incorporation of carbon in deposited CIGS materials. The selenium/Group 1b/Group 3a ink and methods of the present invention provide deposited CIGS materials having $\leq 10$ wt % carbon; more preferably $\leq 5$ wt % carbon; most preferably 0 to $\leq 1$ wt % carbon.

Using the method of depositing selenium/Group 1b/Group 3a material of the present invention, it is possible to provide uniform or graded semiconductor films comprising a selenium/Group 1b/Group 3a material (e.g., a CIGS material). For example, a graded CIGS material can be prepared by depositing varying formulations of the selenium/Group 1b/Group 3a ink of the present invention with different relative concentrations of the selenium, Group 1b and Group 3a components (i.e., by depositing multiple layers of the precursor materials in different compositions). In the preparation of CIGS materials it is sometimes desirable to provide graded films (e.g., with respect to Ga concentration). It is conventional to provide a graded Ga/(Ga+In) ratio as a function of depth in a CIGS material for use in photovoltaic devices to facilitate improved separation of the photogenerated charge carriers and to facilitate reduced recombination at the back contact. Accordingly, it is believed to be desirable to tailor the CIGS material composition to achieve the desired grain structure and the highest efficiency photovoltaic device characteristics.

Some embodiments of the present invention will now be described in detail in the following Examples.

Example 1

Preparation Group 3a/Organic Chalcogenide Component

In a nitrogen glove box, indium metal (shot, 99.99%, from Alfa Aesar) (1 g) and ethylene diamine (99+% from Acros Organics) (16.5 g) were added to a reactor. The reactor was sealed and removed from the glove box, and run with a nitrogen manifold thereafter. By syringe, di-n-butyldisulfide (98% from Acros Organics) (2.5 g) was added to the reactor. The reactor contents were then refluxed at 120° C. for six hours, at which point some indium metal was still visible. The reaction was left at room temperature overnight, and the next day di-n-butyldisulfide (0.84 g) was added to the reactor and refluxed for a further eight hours. The resulting clear solution (5% w/w indium) was transferred by cannula to a storage container, and used as synthesized for thin film deposition.

Example 2

Preparation Group 3a/Organic Chalcogenide Component

Indium metal (shot, 99.99%, from Alfa Aesar) (2 g), ethylene diamine (99+% from Acros Organics) (33.16 g) and 2-hydroxyethyldisulfide (90% from Alfa Aesar) (4.84) were combined in a 100 mL 1-neck flask outfitted with a condenser. The flask contents was purged with nitrogen and then refluxed at 120° C. for twenty-one hours, at which point a large portion of the indium was consumed forming a brownish-orange solution. The brownish-orange solution product Group 3a/organic chalcogenide component was transferred via cannula to a vial. The product Group 3a/organic chalcogenide component was estimated to have a 3.75 wt % concentration of indium metal based on the weight of indium remaining in the flask following cannulation.

Example 3

Preparation Combined Selenium/Organic Chalcogenide Component

Selenium powder, 200 mesh (from Strem Chemicals, Inc.) (10.33 g) was weighed into a 250 mL 3-neck flask. Ethylene diamine (99+% from Acros Organics) (85.0 g) was then added to the flask. The flask was then sealed with two septa and a reflux condenser, and then purged with nitrogen. After the nitrogen purge, di-n-butyldisulfide (98% from Acros Organics) (4.67 g) was added to the flask via syringe. The contents of the flask were then heated to reflux with stirring for six hours producing a black solution product combined selenium/organic chalcogenide component. The product combined selenium/organic chalcogenide component solution (10.33% w/w Se) was stored under nitrogen until use.

Example 4

Preparation Group 1b Material/Ligand Component

Copper (II) nitrate hydrate (0.194 g) was weighed into a first vial and mixed with water (1 g). In a second vial, water (3.2 g) and diethylamine (0.366 g) were mixed in a fume hood. Carbon disulfide (0.130 g) was added to then added to the second vial with mixing. Once all the carbon disulfide dissolved in the aqueous phase in the second vial, the contents of the second vial were added to the first vial, forming brown solids upon mixing. The product solution was filtered using water, then the solids are dried overnight in a 23° C. vacuum oven, to yield 0.239 g of a brown powder. ICP-CHN analysis and FTIR verify that the isolated brown powder was $Cu(S_2CNEt_2)_2$. A Group 1b material/ligand component was then prepared by dissolving the isolated brown powder (113 mg) in 1,3-diaminopropane (99% from Acros Organics) (1220 mg). The resulting Group 1b material/ligand component solution was calculated to contain 1.5% w/w copper.

Example 5

Preparation Group 1b Material/Ligand Component

Cuprous oxide (0.227 g) were weighed out in air in a vial. The vial was then purged with nitrogen. Anhydrous tetrahydrofuran (10 mL) was then added to the vial by syringe 10 mL. Diethylamine (0.524 g) was then added to the vial via syringe. Stirring of the vial contents was then commenced. Carbon disulfide (0.248 g) was then slowly added to the vial over the course of 1 minute using a syringe. A dark brown color developed. The vial contents were allowed to continue stirring for 30 minutes at room temperature. The vial contents were then allowed to settle. Water (30 mL) and ethanol (10 mL) were then added to the contents of the vial. The contents of the vial were then cooled to 4° C. and filtered. The filtered solids were then dried overnight in a 23° C. vacuum oven forming a product brown solid (504 mg). A Group 1b material/ligand component was then prepared by dissolving the isolated brown powder (27 mg) in 1,3-diaminopropane (99% from Acros Organics) (375 mg). The resulting Group 1b material/ligand component was calculated to contain 2% w/w copper.

Example 6

Preparation Group 1b Material/Ligand Component

To a 8 mL parallel reactor tube, copper (II) chloride (anhydrous, 98% from Strem Chemicals, Inc.) (118 mg), p-toluenethiol (98% from Acros Organics) (218 mg), and 1,3-diaminopropane (99% from Acros Organics) (2.46 g) were added in air. The reactor was then sealed and inerted with nitrogen. The reactor was then heated to 80° C. and held there for two hours, with magnetic stirring. The reactor was then cooled to room temperature, and the product Group 1b material/ligand component solution was then stored under nitrogen until use. The product Group 1b material/ligand component solution was calculated to contain 2% w/w copper.

Example 7

Preparation Group 1b Material/Ligand Component

To a 8 mL parallel reactor tube, copper (II) chloride (anhydrous, 98% from Strem Chemicals, Inc.) (118 mg), 1,3-propanedithiol (98%, from Acros Organics) (190 mg), and 1,3-diaminopropane (99% from Acros Organics) (2.49 g) were added in air. The reactor was then sealed and inerted with nitrogen. The reactor was then heated to 80° C. and held there for two hours, with magnetic stirring. The reactor was then cooled to room temperature, and the product Group 1b material/ligand component solution was then stored under nitrogen until use. The product Group 1b material/ligand component solution was calculated to contain 2% w/w copper.

Example 8

Preparation Group 1b Material/Ligand Component

To a 8 mL parallel reactor tube, copper (II) chloride (anhydrous, 98% Strem Chemicals, Inc.) (118 mg), alpha-toluenethiol (99% from Acros Organics) (218 mg), and 1,3-diaminopropane (99% from Acros Organics) (2.46 g) were added in air. The reactor was then sealed and inerted with nitrogen. The reactor was then heated to 80° C. and held there for two hours, with magnetic stirring. The reactor was then cooled to room temperature, and the product Group 1b material/ligand component solution was then stored under nitrogen until use. The Group 1b material/ligand component solution was calculated to contain 2% w/w copper.

Example 9

Preparation Group 1b Material/Ligand Component

To a 8 mL parallel reactor tube, copper (II) chloride (anhydrous, 98% Strem Chemicals, Inc.) (118 mg), beta-mercaptoethanol (99% from Acros Organics) (206 mg), and 1,3-diaminopropane (99% from Acros Organics) (2.48 g) were added in air. The reactor was then sealed and inerted with nitrogen. The reactor was then heated to 80° C. and held there for two hours, with magnetic stirring. The reactor was then cooled to room temperature, and the product Group 1b material/ligand component solution was then stored under nitrogen until use. The product Group 1b material/ligand components solutions was calculated to contain 2% w/w copper.

Example 10

Preparation Group 1b Material/Ligand Component

To a 20 mL septa-capped vial, copper (II) chloride (anhydrous, 98% Strem Chemicals, Inc.) (211 mg) and 3-amino-1-propanol (99% from Acros Organics) (4.30 g) were added in air. The vial was then sealed and inerted with nitrogen. Dimethylsulfoxide (99% from Aldrich) (489 mg) was added to the vial via syringe. The vial was then heated to 80° C. and held there for two hours, with magnetic stirring. The vial was then cooled to room temperature, and the product Group 1b material/ligand component solution was then stored under nitrogen until use. The product Group 1b material/ligand component solution was calculated to contain 2% w/w copper.

Example 11

Preparation Group 1b Material/Ligand Component

To a 20 mL septa-capped vial, copper (II) chloride (anhydrous, 98% Strem Chemicals, Inc.) (211 mg) and 3-amino-1-propanol (99% from Acros Organics) (4.40 g) were added in air. The vial was then sealed and inerted with nitrogen.

2,3-dimercaptopropanol (99% from Aldrich) (389 mg) was then added to the vial via syringe. The vial was then heated to 80° C. and held there for two hours, with magnetic stirring. The vial was then cooled to room temperature, and the product Group 1b material/ligand component solution was then stored under nitrogen until use. The product Group 1b material/ligand component solutions was calculated to contain 2% w/w copper.

Example 12

Preparation Group 1b Material/Ligand Component

To a 20 mL septa-capped vial, cuprous oxide (97% from Acros Organics) (452 mg) and 1,3-diaminopropane (99% from Acros Organics) (8.56 g) were added in air. The vial was then sealed and inerted with nitrogen. Beta-mercaptoethanol (99% from Acros Organics) (988 mg) was added to the vial via syringe. The vial was then heated to 100° C. and held there for ten minutes, with magnetic stirring. The vial was then cooled to room temperature, and the product Group 1b material/ligand component solution was then stored under nitrogen until used. The product Group 1b material/ligand component solutions was calculated to contain 4% w/w copper.

Example 13

Preparation Group 1b Material/Ligand Component

To a 20 mL septa-capped vial, cuprous oxide (97% from Acros Organics) (452 mg) and 1,3-diaminopropane (99% from Acros Organics) (8.86 g) were added in air. The vial was then sealed and inerted with nitrogen. 1,3-propanedithiol (98% from Acros Organics) (686 mg) was added to the vial via syringe. The vial was then heated to 100° C. and held there for ten minutes, with magnetic stirring. The vial was then cooled to room temperature, and the product Group 1b material/ligand component solution was then stored under nitrogen until used. The product Group 1b material/ligand component solutions was calculated to contain 4% w/w copper.

Examples 14-25

Preparation Selenium/Group 1b/Group 3a Inks

The selenium/Group 1b/Group 3a ink formulations of Examples 14-25 were prepared by combining the component solutions in the amounts noted in TABLE 1. Specifically, in each of Examples 14-25 the component solutions noted in TABLE 1 were weighed out in a nitrogen glove box in the amounts noted. The component solutions were then mixed in a vial by first adding the Group 3a/organic chalcogenide component ("G3a-OC component"), followed by the addition of the combined selenium/organic chalcogenide component ("cSe—OC component") and then the addition of the Group 1b material/ligand component ("G1b-L component"). The vials containing the product selenium/Group 1b/Group 3a inks were then capped with a Teflon cap until use.

TABLE 1

| Ex. | G3a-OC Component | G3a-OC (in mg) | cSe-OC Component | cSe-OC (in mg) | G1b-L Component | G1b-L (in mg) |
|---|---|---|---|---|---|---|
| 14 | Prod. Ex. 1 | 63 | Prod. Ex. 3 | 37 | — | — |

TABLE 1-continued

| Ex. | G3a-OC Component | G3a-OC (in mg) | cSe-OC Component | cSe-OC (in mg) | G1b-L Component | G1b-L (in mg) |
|---|---|---|---|---|---|---|
| 15 | Prod. Ex. 1 | 81 | Prod. Ex. 3 | 68 | Prod. Ex. 4 | 150 |
| 16 | Prod. Ex. 1 | 93 | Prod. Ex. 3 | 78 | Prod. Ex. 5 | 129 |
| 17 | Prod. Ex. 1 | 93 | Prod. Ex. 3 | 78 | Prod. Ex. 6 | 129 |
| 18 | Prod. Ex. 1 | 93 | Prod. Ex. 3 | 78 | Prod. Ex. 7 | 129 |
| 19 | Prod. Ex. 1 | 93 | Prod. Ex. 3 | 78 | Prod. Ex. 8 | 129 |
| 20 | Prod. Ex. 1 | 93 | Prod. Ex. 3 | 78 | Prod. Ex. 9 | 129 |
| 21 | Prod. Ex. 1 | 93 | Prod. Ex. 3 | 78 | Prod. Ex. 10 | 129 |
| 22 | Prod. Ex. 1 | 93 | Prod. Ex. 3 | 78 | Prod. Ex. 11 | 129 |
| 23 | Prod. Ex. 1 | 119 | Prod. Ex. 3 | 99 | Prod. Ex. 12 | 82 |
| 24 | Prod. Ex. 1 | 119 | Prod. Ex. 3 | 99 | Prod. Ex. 13 | 82 |
| 25 | Prod. Ex. 2 | 1,503 | Prod. Ex. 3 | 938 | Prod. Ex. 8 | 1,559 |

Selenium/Group 1b/Group 3a Material Film Deposition & Analysis

The product films deposited on a molybdenum substrate layer in each of Examples 26-37 were analyzed by energy dispersive x-ray spectroscopy ("EDS") as noted in TABLE 2. The EDS samples were mounted on conductive carbon tape and examined uncoated in a Hitachi 3400 VP-SEM in variable pressure mode. The EDS spectra were collected with a 30 mm$^2$ SD Detector at 15 KeV. The EDS data provides the weight % ratio between the selenium, Group 1b material, and the Group 3a material in the deposited films. The weight % ratios were then converted to give the stoichiometry of the Se, Cu and In elements with respect to each other (discounting the molybdenum background signal and any other atoms detected). The product films were also analyzed for residual carbon content. The residual carbon contents reported in TABLE 2 were determined by either combustion carbon analysis technique or EDS data as noted. Combustion elemental analysis was carried out by Robertson Microlit Laboratories (in New Jersey) by scraping the deposited material off of the molybdenum substrate layers and performing the standard combustion carbon analysis ("CHN") analysis.

Example 26

Deposition of Selenium/Group 1b/Group 3a Material on Substrate

A selenium/Group 1b/Group 3a material was deposited on a substrate by placing one drop of the selenium/Group 1b/Group 3a ink formulation of Example 14 onto a substrate, namely a molybdenum coated glass slide at room temperature in a nitrogen glove box. The slide was located on a hot plate during the deposition process. Following placement of the one drop of ink formulation on the substrate, the hot plate temperature was set to 150° C. Upon reaching 150° C., the temperature of the hot plate was maintained at that temperature for five minutes before raising the temperature setting on the hot plate to 300° C. Upon reaching 300° C., the temperature of the hot plate was maintained at that temperature for five minutes before raising the temperature setting on the hot plate to 350° C. Upon reaching 350° C., the temperature of the hot plate was maintained at that temperature for five minutes. The hot plate was then turned off and the substrate was allowed to cool on the surface of the hot plate.

Example 27-37

Deposition of Selenium/Group 1b/Group 3a Material on Substrate

In a nitrogen glove box, a selenium/Group 1b/Group 3a material was deposited on a substrate. The substrate used in each of Examples 27-37 was a 1×1 inch piece of molybdenum coated glass substrate. The following procedure was used in each of Examples 27-37. The substrate was first heated on a hotplate set at 80° C. Then twelve drops of the selenium/Group 1b/Group 3a ink formulation noted in TABLE 2 were then placed on the substrate. After placing the selenium/Group 1b/Group 3a ink on the substrate, the hot plate set point temperature was ramped to 400° C. over a ramp time of about 15 minutes. The hot plate set point temperature was then held for 15 minutes at 400° C., before being switched off. The substrate was then allowed to cool to room temperature on the surface of the hotplate.

TABLE 2

| Ex. | Ink Formulation | Comp. Deposited Film determined EDS (in wt %) | | | | Residual C (in wt %) | | Comments |
|---|---|---|---|---|---|---|---|---|
| | | (Cu) | (In) | (Se) | (S) | EDS | CHN | |
| 26 | Prod. Ex. 14 | 0 | 1 | 1.07 | 0 | 0 | — | |
| 27 | Prod. Ex. 15 | — | — | — | — | — | — | unstable |
| 28 | Prod. Ex. 16 | 0.8 | 1 | 1.24 | 0 | — | 0.80 | |
| 29 | Prod. Ex. 17 | 1.13 | 1 | 1.57 | 0 | — | 1.97 | |
| 30 | Prod. Ex. 18 | 1.01 | 1 | 1.65 | 0 | — | 1.92 | |
| 31 | Prod. Ex. 19 | 0.88 | 1 | 1.39 | 0.19 | — | 3.06 | |
| 32 | Prod. Ex. 20 | 1.04 | 1 | 1.42 | 0.11 | — | 2.65 | |
| 33 | Prod. Ex. 21 | — | — | — | — | — | — | unstable |
| 34 | Prod. Ex. 22 | 1.0 | 1 | 1.40 | 0.35 | — | 5.92 | |
| 35 | Prod. Ex. 23 | 0.98 | 1 | 1.47 | 0 | — | 2.21 | |
| 36 | Prod. Ex. 24 | 1.19 | 1 | 1.46 | 0.10 | — | 2.0 | |
| 37 | Prod. Ex. 25 | 0.86 | 1 | 1.60 | 0 | <1[£] | 4.25 | |

[£]Longer processing at 400° C. or above reduced carbon content to below 1 wt % (w/w) by XPS analysis

We claim:

1. A selenium/Group 1b/Group 3a ink, comprising:
   (a) a selenium/Group 1b/Group 3a system which comprises a combination of, as initial components:
      a selenium;
      an organic chalcogenide component: comprising at least one organic chalcogenide having a formula selected from RZ—Z'R' and R²—SH; wherein Z and Z' are independently selected from the group consisting of sulfur, selenium and tellurium; wherein R is selected from the group consisting of H, $C_{1-20}$ alkyl group, a $C_{6-20}$ aryl group, a $C_{1-20}$ hydroxyalkyl group, a $C_{1-20}$ mercaptoalkyl group and an ether group; wherein R' and R² are selected from the group consisting of a $C_{1-20}$ alkyl group, a $C_{6-20}$ aryl group, a $C_{1-20}$ hydroxyalkyl group, a $C_{1-20}$ mercaptoalkyl group and an ether group;
      a Group 1b containing substance comprising, as an initial component, at least one of $CuCl_2$ and $Cu_2O$;
      a bidentate thiol component, wherein the bidentate thiol component is selected from the group consisting of 1,2-dimercaptoethane; 1,3-dimercaptopropane; beta-mercaptoethanol and dimercaptol;
      a Group 3a containing substance comprising, as an initial component: a Group 3a material selected from the group consisting of aluminum, indium, gallium and combinations thereof; and,
   (b) a liquid carrier component;
   wherein the selenium/Group 1b/Group 3a system is stably dispersed in the liquid carrier component.

2. The selenium/Group 1b/Group 3a ink of claim 1, wherein the liquid carrier component is selected from the group consisting of a nitrogen containing solvent and miscible mixtures of nitrogen containing solvents.

3. The selenium/Group 1b/Group 3a ink of claim 1, wherein the liquid carrier component is selected from the group consisting of a liquid amine having a formula $NR_3$, wherein each R is independently selected from a H, a $C_{1-10}$ alkyl group, a $C_{6-10}$ aryl group and a $C_{1-10}$ aminoalkyl group.

4. The selenium/Group 1b/Group 3a ink of claim 1, wherein the liquid carrier component is selected from the group consisting of ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1-amino-2-propanol; 1,3-diaminopropane; 1,2-diaminopropane; 1,2-diaminocyclohexane; pyridine; pyrrolidine; 1-methylimidazole; tetramethylguanidine and mixtures thereof.

5. The selenium/Group 1b/Group 3a ink of claim 1, wherein the molar ratio of selenium to copper to Group 3a material is from 2:0.5:1 to 10:1.5:1.

6. A method of preparing a selenium/Group 1b/Group 3a ink according to claim 1, comprising:
   providing a selenium;
   providing an organic chalcogenide component, comprising: a first organic chalcogenide and a second organic chalcogenide both having a formula independently selected from the group consisting of RZ—Z'R' and R²—SH; wherein Z and Z' are independently selected from the group consisting of sulfur, selenium and tellurium; wherein R is selected from the group consisting of H, $C_{1-20}$ alkyl group, a $C_{6-20}$ aryl group, a $C_{1-20}$ hydroxyalkyl group, a $C_{1-20}$ mercaptoalkyl group and an ether group; wherein R' and R² are selected from the group consisting of a $C_{1-20}$ alkyl group, a $C_{6-20}$ aryl group, a $C_{1-20}$ hydroxyalkyl group, a $C_{1-20}$ mercaptoalkyl group and an ether group;
   providing a Group 1b containing substance comprising, as an initial component: at least one of $CuCl_2$ and $Cu_2O$;
   providing a Group 1b ligand component;
   providing a Group 3a containing substance comprising, as an initial component: a Group 3a material selected from the group consisting of aluminum, indium, gallium and combinations thereof;
   providing a liquid carrier component, comprising: a first liquid carrier, a second liquid carrier and a third liquid carrier;
   combining the selenium, the first organic chalcogenide and the first liquid carrier; heating the combination with agitation to produce a combined selenium/organic chalcogenide component;
   combining the Group 1b containing substance, the Group 1b ligand component and the second liquid carrier to produce a Group 1b material/ligand component;
   combining the Group 3a containing substance, the second organic chalcogenide and the third liquid carrier to produce a Group 3a/organic chalcogenide component;
   combining the combined selenium/organic chalcogenide component, the Group 1b material/ligand component and the Group 3a/organic chalcogenide component to form the selenium/Group 1b/Group 3a ink; wherein the selenium/Group 1b/Group 3a ink is a stable dispersion; and, wherein the first liquid carrier, the second liquid carrier and the third liquid carrier are the same or are miscible together.

7. A method for depositing a selenium/Group 1b/Group 3a material on a substrate, comprising:
provide a substrate;
providing a selenium/Group 1b/Group 3a ink according to claim 1;
depositing the selenium/Group 1b/Group 3a ink on the substrate;
heating the deposited selenium/Group 1b/Group 3a ink to eliminate the first liquid carrier, the second liquid carrier and the third liquid carrier leaving a selenium/Group 1b/Group 3a material on the substrate; and,
optionally, annealing the selenium/Group 1b/Group 3a material;
wherein the selenium/Group 1b/Group 3a material is according to the formula $Na_L Cu_m Ga_d In_{(1-d)} S_{(2+e)(1-f)} Se_{(2+e)f}$, wherein $0 \leq L \leq 0.25$, $0.25 \leq m \leq 1.5$, $0 \leq d \leq 1$, $-0.2 \leq e \leq 0.5$, $0 < f \leq 1$; wherein $0.5 \leq (L+m) \leq 1.5$ and $1.8 \leq \{(2+e)f+(2+e)(1-f)\} \leq 2.5$.

8. The method of claim 7, wherein the selenium/Group 1b/Group 3a material deposited on the substrate contains <5 wt % residual carbon contaminant.

9. The method of claim 8, wherein the substrate comprises a layer of molybdenum.

10. The method of claim 7, wherein the substrate comprises a layer of molybdenum.

* * * * *